United States Patent

Kokosa

[15] 3,681,667

[45] Aug. 1, 1972

[54] CONTROLLED RECTIFIER AND TRIAC WITH LATERALLY OFF-SET GATE AND AUXILIARY SEGMENTS FOR ACCELERATED TURN ON

[72] Inventor: Richard A. Kokosa, Skaneateles, N.Y.

[73] Assignee: General Electric Company

[22] Filed: Dec. 12, 1969

[21] Appl. No.: 884,660

[52] U.S. Cl. .....317/235 R, 317/234 N, 317/235 AA, 317/235 AB

[51] Int. Cl. ..........................H01l 11/00, H01l 15/00

[58] Field of Search.........317/234, 235, 40, 41, 41.1; 307/305

[56] References Cited

UNITED STATES PATENTS

| | | | |
|---|---|---|---|
| 3,397,349 | 8/1968 | Clark | 317/235 |
| 3,401,320 | 9/1968 | Weinstein | 317/235 |
| 3,409,810 | 11/1968 | Matzen | 317/235 |
| 3,435,515 | 4/1969 | Kurpisz et al. | 317/235 |
| 3,465,216 | 9/1969 | Teszner | 317/235 |
| 3,475,666 | 10/1969 | Hutson | 317/235 |
| 3,504,241 | 3/1970 | Dumanevich et al. | 317/235 |
| 3,123,750 | 3/1964 | Hutson | 317/235 |
| 3,444,444 | 5/1969 | Yamashita et al. | 317/235 |
| 3,549,961 | 12/1970 | Gault | 317/235 |
| 3,573,572 | 4/1971 | Cooper | 317/235 |

*Primary Examiner*—John W. Huckert
*Assistant Examiner*—Andrew J. James
*Attorney*—Robert J. Mooney, Nathan J. Cornfeld, Carl O. Thomas, Frank L. Neuhauser, Oscar B. Waddell and Joseph B. Forman

[57] ABSTRACT

A semiconductive element is provided having five successive layers of alternate conductivity type in which a first endmost layer is divided into a gate segment and an auxiliary segment. The auxiliary segment is interposed between a main zone and an auxiliary zone of an adjacent intermediate layer. A junction bridging conductor extends from the auxiliary zone to an adjacent edge of the auxiliary segment while the remaining edge of the auxiliary segment is located in lateral proximity to a main portion of a remaining endmost layer. Ohmic contacts are associated with the main zone and the main portion. An auxiliary portion of the remaining endmost layer may be divided from the main portion thereof. A junction bridging connector may extend from the auxiliary portion toward the main portion at a location near the edge of the main zone associated with the auxiliary segment. The auxiliary portion and the auxiliary segment may both be distributed or further sub-divided. A dielectric may be provided to overlie the connectors or the edge of the semiconductive element. The semiconductive element may be incorporated in a triac.

31 Claims, 10 Drawing Figures

INVENTOR:
RICHARD A. KOKOSA,
BY Carl O. Thomas
HIS ATTORNEY.

INVENTOR:
RICHARD A. KOKOSA,

BY Carl O. Thomas
HIS ATTORNEY.

INVENTOR:
RICHARD A. KOKOSA,
BY Carl O. Thomas
HIS ATTORNEY.

INVENTOR:
RICHARD A. KOKOSA,
BY Carl O. Thomas
HIS ATTORNEY.

CONTROLLED RECTIFIER AND TRIAC WITH LATERALLY OFF-SET GATE AND AUXILIARY SEGMENTS FOR ACCELERATED TURN ON

My invention is directed to remote gate controlled thyristors having improved switching capabilities.

As is well understood in the art gate controlled thyristors are limited in the rate at which current conduction can be increased, typically referred to as *di/dt*. It has also been observed that the maximum safely employable value of *di/dt* for a given thyristor is a direct function of the value of the gate signal being utilized to control the thyristor.

I have invented a novel remote gate controlled thyristor structure which increases acceptable *di/dt* levels and which accordingly permits weaker gate signals to be employed in obtaining a given turn on rate. Additionally, in one form, my invention is directed to a remote gate controlled thyristor structure in which acceptable values of *di/dt* are increased whether the device is switched to its conducting mode by a gate or by main terminal applied voltages. In an additional aspect my invention incorporates lateral resistances into my remote gate thyristor structure to assist in distributing turn on. My remote gate thyristor structure may be utilized also to provide a triac having improved turn on characteristics.

In one aspect my invention is directed to a thyristor comprised of a semiconductive element including five layers of one and the opposite conductivity type. The layers are interleaved with adjacent layers being of opposite conductivity type and forming a plurality of P-N junctions. The layers include a first endmost layer and a first intermediate layer next adjacent thereto. The first endmost layer includes a gate segment and an auxiliary segment spaced laterally therefrom. The first intermediate layer includes an auxiliary zone interposed between the gate segment and the auxiliary segment, a main zone laterally spaced from the auxiliary zone by the auxiliary segment, and injection zone means underlying the endmost layer. The injection zone means unites the main and auxiliary zones. A gate contact is ohmically associated with the gate segment. Means are provided to form a junction bridging conductive path from the auxiliary segment to the auxiliary zone. A first major contact is ohmically associated with the main zone, and a second major contact is ohmically associated with a remaining endmost of the layers.

In another aspect my invention is directed to a semiconductor switch comprising a single semiconductive crystal means having integrated therein a remote gate main current carrying thyristor crystal means and a remote gate auxiliary thyristor crystal means. Each of the thyristor crystal means includes a gate layer, a first emitter layer, a first base layer, a second base layer, and a second emitter layer which are sequentially related. Adjacent layers are of opposite conductivity type and form a plurality of P-N junctions therebetween. The emitter and base layers of the main and auxiliary thyristor crystal means are integrally related. The gate layers of the main and auxiliary thyristor crystal means are laterally spaced. Gate means is associated with the auxiliary gate layer. Means are provided to form a junction bridging conductive path from the auxiliary first emitter layer to the main gate layer. A major current carrying contact is ohmically associated with the main first emitter layer, and additional contact means are ohmically associated with said second emitter layers.

My invention may be better understood by reference to the following detailed description considered in conjunction with the drawings, in which FIG. 1 is a vertical section of a gate controlled thyristor according to my invention with the semiconductive element being shown in elevation;

Figure 2:
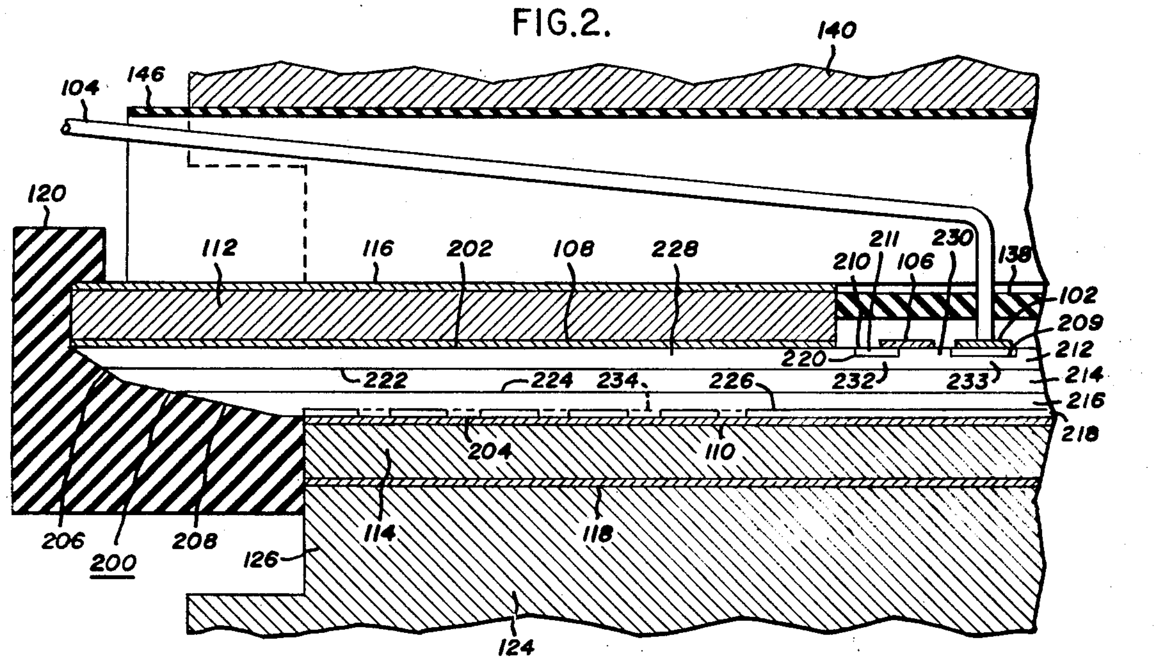
FIG. 2 is a sectional detail of the controlled thyristor of FIG. 1.
Figure 7:
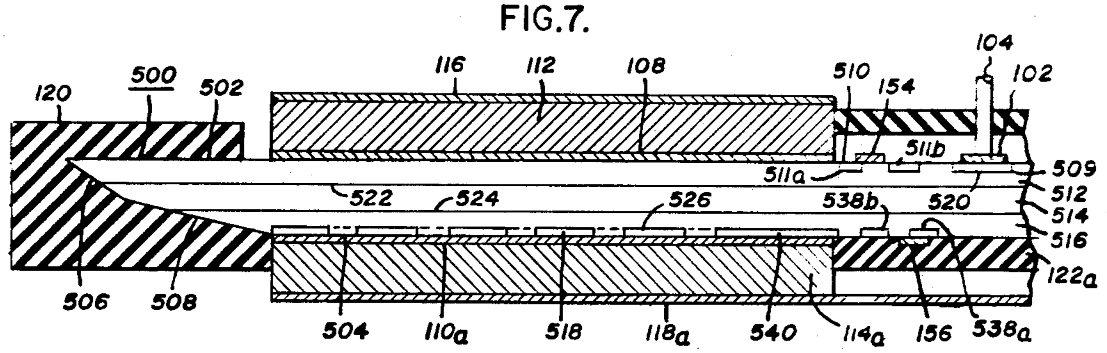
Figure 6A:
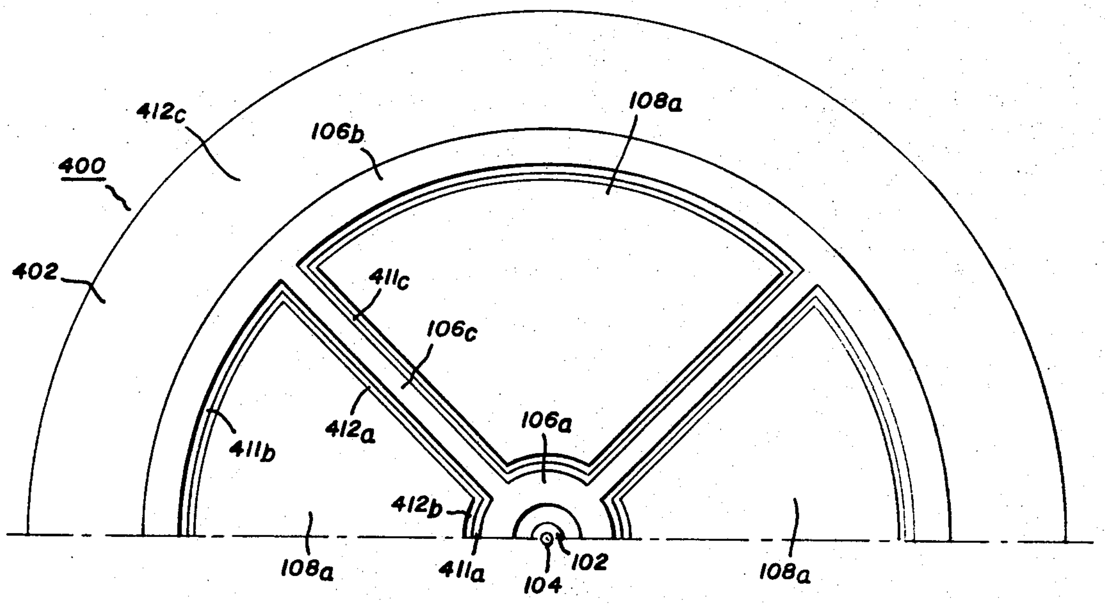
Figure 6B:
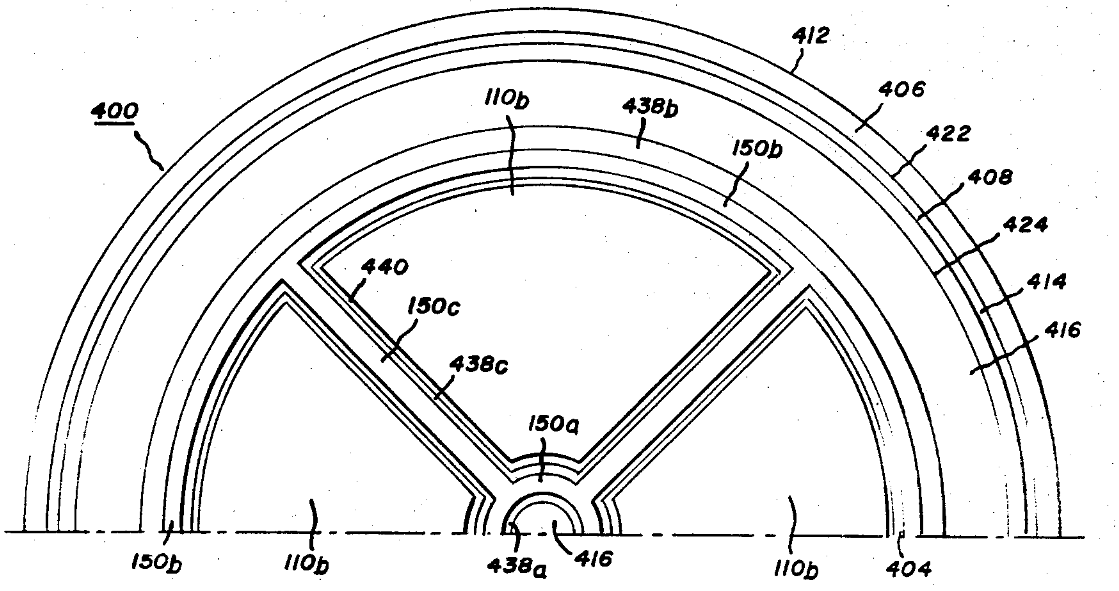
Figure 8:
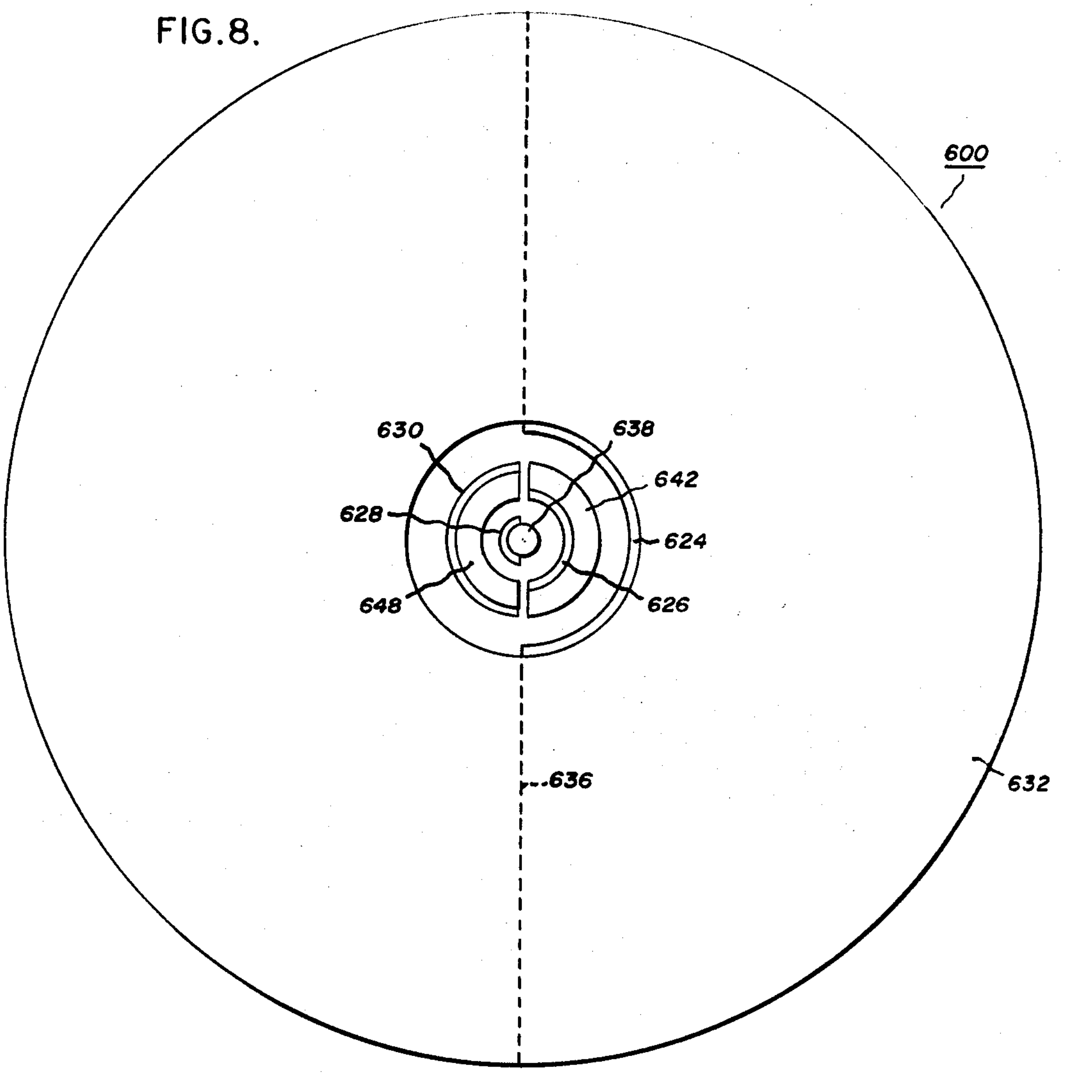
Figure 9:
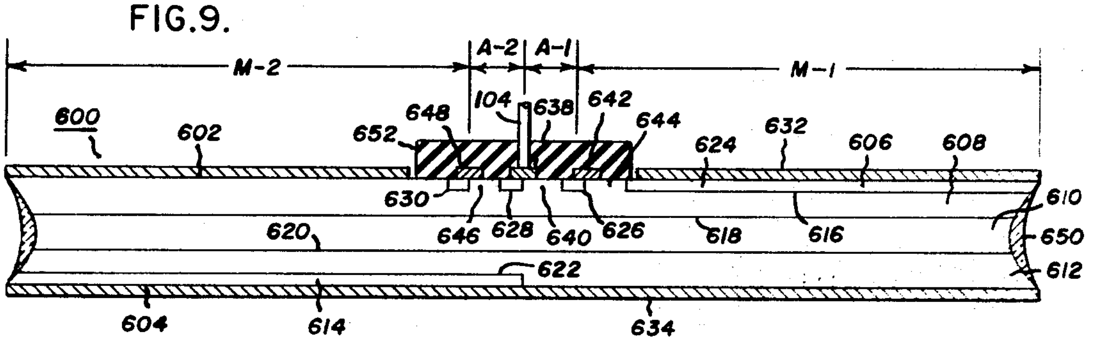

FIGS. 6*a* and 6*b* are plan views of the semiconductive element, contacts, and conduction layers, FIG. 6*a* being a plan view of the first major surface and FIG. 6*b* a plan view of the second major surface;

FIG. 7 is a sectional detail similar to FIG. 2 of a fourth embodiment of my invention;

FIG. 8 is a plan view of a triac semiconductive element, contacts, and conduction layers; and FIG. 9 is a vertical sectional view through the triac semiconductive element, contacts, and conduction layers and additionally showing a dielectric body associated therewith.

Each of the semiconductive elements, contacts, and conduction layers shown in FIGS. 1 through 7 inclusive are symmetrical about the center axis. Section lines are omitted from the semiconductive elements to avoid cluttering the drawings. The thicknesses of the semiconductive elements are exaggerated in the drawings to allow the layers thereof to be readily viewed.

Figure 1:
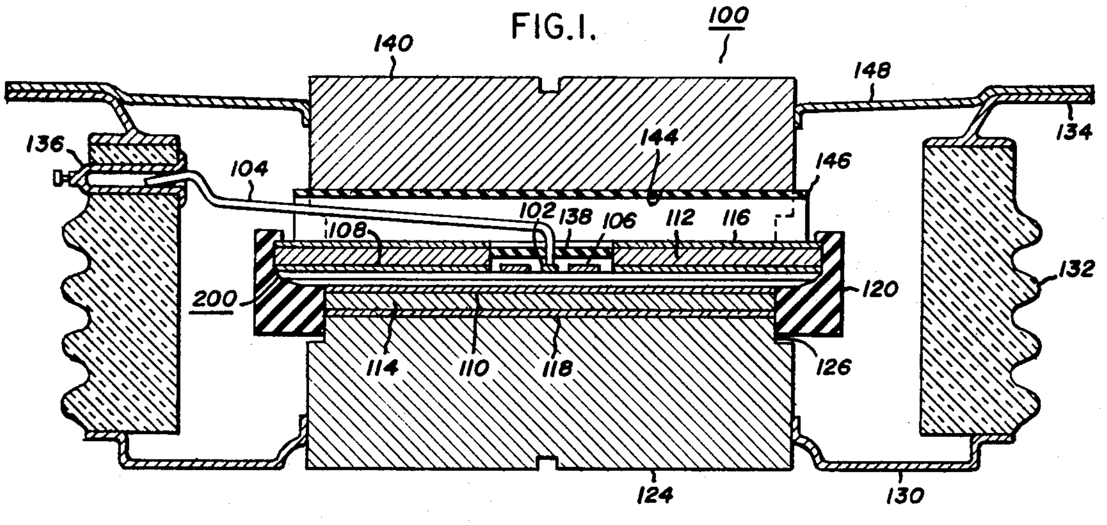

In FIG. 1 a controlled rectifier or thyristor 100 is shown provided with a semiconductive element 200. As best appreciated by reference to FIG. 2, the monocrystalline semiconductive element 200 is provided with first and second opposed major surfaces 202 and 204, respectively, joined by annular beveled peripheral surfaces 206 and 208. The semiconductive element is formed of a single semiconductive crystal, preferably a silicon crystal, which is divided into five sequential, successive zones or layers 210, 212, 214, 216, and 218. Adjacent of the zones are of opposite conductivity type or, alternately stated, zones of a first conductivity type are interleaved with zones of opposite conductivity type, so that a plurality of junctions 220, 222, 224, and 226 are formed between the adjacent layers. First endmost layer 210, is located adjacent the first major surface and forms a junction 220 with next adjacent intermediate layer 212, hereinafter designated a first emitter layer. The first endmost layer is divided into a gate segment 209 and a uniformly spaced annular auxiliary segment 211. First base layer 214 forms with the first emitter layer a first emitter junction 222 and forms with second base layer 216 a base junction 224. The second base layer forms with the second emitter layer 218 a second emitter junction 226. In the preferred form the first base and second emitter layers as well as the gate and auxiliary segments are of N conductivity type while the first emitter and second base layers are of P conductivity type. It is, of course, recognized that the conductivity types could be reversed, in which case a complementary thyristor would be formed.

According to common manufacturing techniques it is recognized that the first base layer will normally exhibit highest resistivity, the first emitter and second base layers intermediate resistivity, and the first and second endmost layers lowest resistivity, since the semiconductive crystal may initially exhibit conductivity characteristics corresponding to that of the first base layer while the first emitter and second base layers may be formed by first impurity diffusion and the endmost layers may be formed by one or more subsequent diffusions.

Accordingly, the beveled peripheral surface 206 will normally form a positive bevel angle at its edge intersection with the first emitter junction while the beveled peripheral surface 208 will form a negative bevel angle with the base junction 224. While beveled peripheral surfaces are not essential to the practice of my invention, I prefer to form a positive bevel angle with the first emitter junction of less than 90 degrees and normally less than 45 degrees, it being recognized that the shallower the acute included angle between the beveled surface 206 and the first emitter junction the higher will be the surface voltage blocking capabilities of this junction. The negative acute included bevel angle between the base junction and beveled surface 208 is preferably maintained in the range of from 4° to 20°, most preferably from 4° to 9°. It is normally preferred to choose the bevel angles of the peripheral surfaces so that surface voltage blocking capabilities of the junctions exceed the avalanche or bulk voltage capabilities. In such instance if excessive voltage differentials (or excessive rates of voltage increase) are imposed between the major surfaces of the semiconductive element to drive the semiconductive element into conduction without a gate signal, non-destructive turn on of the device will occur rather than destructive surface current conduction. It is recognized that the choice of peripheral surface bevels to allow selective avalanche or bulk breakdown of semiconductor devices is conventional and is pertinent to my invention only in combination with structural features to be described hereinafter.

It is to be noted that the auxiliary segment of the first endmost layer is interposed between a main zone 228 and an auxiliary zone 230 of the first emitter layer which are integrally joined by an injection zone 232. The injection zone 232 underlies the auxiliary segment of the first endmost layer. A second injection zone 233 underlies the gate segment of the first endmost layer. The second base layer is shown provided with a plurality of dot shorts 234 that extend to the second major surface through apertures in the second emitter layer. The dot shorts are generally uniformly distributed over the surface area subtended by the second emitter layer, except that the dot shorts are preferably spaced outwardly from the outer edge of the auxiliary segment by a distance sufficient to avoid any undue loss of gate sensitivity. Typically the dot short nearest the inner edge of the second emitter layer is spaced at least 15 mils therefrom. For purposes of analyzing the behavior of the semiconductive element the first and second base layers and the second emitter layer may be considered to be made up of integrally joined main portions lying outwardly of the inner edge of the auxiliary segment and auxiliary portions lying inwardly thereof.

Gate metallization 102 is located centrally of the first major surface of the semiconductive element. Typically the gate metallization is of limited lateral extent overlying only the gate segment inwardly of the first emitter layer, and serves merely to provide a low impedance ohmic conduction path between the gate lead 104 and the gate segment. An ohmic conduction layer 106 is shown associated with the inner edge of the auxiliary segment and an adjacent portion of the auxiliary zone of the first emitter layer. The conduction layer 106 thus serves to short the inner edge of the junction 220 associated with the auxiliary segment.

A first major contact 108 is ohmically associated with the first major surface of the semiconductive element overlying substantially the entire main zone of the first emitter layer, but laterally spaced from the outer edge of the junction 220 so that it does not short this junction. A second major contact 110 is ohmically associated with the second major surface. The second major contact shorts the junction 226 where it forms the periphery of the dot shorts. The second major contact may extend laterally beyond the second emitter layer and also may short the outer periphery of the second emitter junction.

While for simplicity the gate metallization, conduction layer, and first and second major contacts are shown formed as unitary metal layers, it is appreciated that these elements may be formed of one or a plurality of layers of like or dissimilar metals, as is well understood in the art. It is preferred that these elements be plated or otherwise bonded directly onto the opposed major surfaces of the semi-conductive element prior to its association with the remaining elements of the semiconductor device, so that these elements form a low impedance interface with the semiconductive element.

It is to be noted that the conduction layer 106 and auxiliary zone 230 are both associated with a portion of the first major surface of the semiconductive element that overlaps a portion of the second major surface associated with the auxiliary portion of the second emitter layer and a portion of the second major contact 110. Alternately viewed, it can be seen that immediately laterally inward of the auxiliary segment of the first endmost layer, the conduction layer, the auxiliary zone, the auxiliary portions of the first and second base and second emitter layers, and the second major contact are sequentially arranged in a direction taken normal to the major surfaces of the semiconductive element. Thus, a PNPN sequence of semiconductive layers is provided. Similarly, the main zone of the first emitter layer and the first main contact are noted to be associated with a portion of the first major surface that overlaps a portion of the second major surface having associated therewith the second emitter layer and the second major contact. Thus, a second, laterally spaced PNPN sequence of semiconductive layers is provided.

Annular back up plate 112 and disc back up 114 are associated with the first and second major contacts, respectively. These back up plates are shown laterally coextensive with the major contacts. Where the semiconductive element is formed of a silicon crystal it is preferred to utilize a metal, such as tungsten, molybdenum, or tantalum, which exhibits a thermal coefficient of expansion of less than $1 \times 10^{-5}$ in/in per °C, most preferably less than $0.5 \times 10^{-5}$ in/in per °C. One or both of the back up plates may be directly bonded to the major contacts or only physically associated therewith, free of direct bonding. The exterior major surfaces of the back up plates are covered with layers 116 and 118 formed of a malleable conductive metal, such as silver or gold.

According to a preferred assembly procedure the back up plate 112 is joined to the semiconductive element after association of the metal layers 102, 106, 108, and 110 so that a sub-assembly is formed. A dielectric body 120 of passivant material is then molded around the periphery of the sub-assembly. The dielectric passivant material is chosen to exhibit a relatively high insulative resistance and dielectric strength and to be substantially impervious to junction contaminants. I prefer to utilize passivant materials having a dielectric strength of at least 100 volts/mil and an insulative resistance of at least $10^{10}$ ohm-cm. A number of commercially available forms of silicone rubber are noted to meet these electrical criteria. It is anticipated that glass or other conventional passivant materials may be interposed between the molded dielectric body and the surface of the semiconductive element. In such case it is recognized that the function of junction passivant and insulation of the semiconductive element peripheral surface will be primarily performed by the interposed passivant and that the electrical and passivant qualifications of the molded dielectric body may be accordingly reduced.

As best seen in FIG. 1 the housing for the semiconductor device is comprised of a lower terminal member 124 typically formed of a conductive metal such as copper. The lower terminal member is provided with a pedestal 126. The dielectric body 120 cooperates with the outer periphery of the pedestal to position the lower back up plate and the semiconductive element with respect thereto.

An annular flange 130 is secured at its inner edge to the periphery of the lower terminal member and is attached to an annular insulator 132 adjacent its outer edge. The insulator is provided with protuberances adjacent its outer edge to increase the creepage path therealong. The insulator is noted to be mounted in laterally spaced relation to the semiconductive element and lower terminal member. An annular flanged sealing ring 134 is secured to the opposite end of the insulator. Typically the lower terminal member, annular flange, annular insulator, and flanged sealing ring are joined as a sub-assembly which receives the sub-assembly formed by the semiconductive element, back up plate 112, metallization layers secured to the semiconductive element and the back up plate, and the dielectric body of molded passivant material. The back up plate may be loosely positioned between contact 110 and the pedestal or secured to one or the other prior to assembly. The malleable layer 118 associated with the exterior major surface of the back up plate 114 next adjacent the pedestal assures an intimate, low impedance electrical contact between the first terminal member and the semiconductive element.

The annular insulator is sealingly fitted with an outwardly closed conductive sleeve 136 which serves as a gate terminal for the device. One extremity of the resilient gate lead 104 is slipped into the inner end of the gate terminal sleeve and the opposite end is positioned to overlie the gate metallization. The resiliency of the gate lead assures that the proper degree of compressive force is maintained on the gate metallization to assure a low impedance gate terminal interconnection to the second base layer through the interfaces of the gate lead with the sleeve and the gate metallization. An insulative spacer 138 is fitted between the gate lead and the inner periphery of the back up plate 112 to insure that these elements remain in spaced relation.

An upper terminal member 140 may be formed identically as the lower terminal member, but is modified by the provision of a diametrical slot 144 through the pedestal. This slot provides clearance between the gate lead and the upper terminal member. To insure that the gate lead is at all times electrically isolated from the upper terminal member an insulative slot liner 146 is provided. Attached to the outer periphery of the second terminal member is an annular sealing flange 148 that may be sealingly associated with the flanged ring 134.

The device is assembled by first assembling the housing of the device into two separate sub-assemblies, one of which is comprised of the upper terminal member and the annular sealing flange. The remaining elements of the housing form the second sub-assembly as above noted. The sub-assembly above described including the semiconductive element (with contiguous metal layers) and the back up plates is positioned on the pedestal of the lower terminal member. The gate lead is thereafter fitted into position. The upper housing sub-assembly is then associated with the upper back up plate, and the annular flange and flanged ring sealed together, as by welding, to complete the device. Preferably the housing for the device hermetically encases the semiconductive element.

The operation of the semiconductor device 100 may be most readily appreciated by considering the first endmost layer 210, first base layer 214, and second emitter layer 218 to be of N conductivity type while the first emitter layer 212 and second base layer 216 are of P conductivity type. In such instance the lower terminal member 124 of the device serves as its cathode while the upper terminal member 140 serves as the device anode. The gate lead 104 is then referenced to the anode potential. As is well understood in the art, when a positive potential is applied to the lower terminal member or cathode as compared to the upper terminal member or anode, the device is in its reverse blocking mode and no current flows through the device. Current flow through the semiconductive element is effectively blocked by reverse biasing of the anode emitter junction 222. Current flow between the cathode and anode around the peripheral edge of the semiconductive element is prevented by the beveling of the edge 206 of the semiconductive element, which lowers the surface potential gradient across the anode emitter junction, and by the dielectric body 120 of passivant material.

Upon forwardly biasing the semiconductor device in the absence of a gate signal, current flow through the semiconductive element is blocked by the base junction 224. The beveled edge 208 and the passivant material of the dielectric body 120 effectively prevent current flow across the base junction at the surface of the semiconductive element. When the device is forward biased the anode is maintained at a positive potential with respect to the cathode.

In order to switch the semiconductor device to its conducting mode while it is forward biased the gate terminal 136 is biased negative with respect to the anode or upper terminal member 140. This causes electrons to be injected from the gate segment across the base junction to drive the center of the semiconductive element into its conductive mode. This may be readily appreciated by considering the central portion of the semiconductive element to approximate an auxiliary thyristor which is integrated with a surrounding main current carrying thyristor. The auxiliary zone 230 of the first emitter layer 212 as well as the portions of the first base, second base, and second emitter layers located centrally of the inner edge of the auxiliary segment 211 and injection junction 220 together form a PNPN sequence of zones that turn on as does a thyristor. In this regard it is to be noted that current conduction from the second emitter layer 218 to the lower terminal member or cathode is through the second major contact 110, the back up plate 114, and the conductive layer 118.

While the conduction layer 106 may be viewed as the anode for the auxiliary thyristor, it is a unique feature of my invention that I isolate the conduction layer from conductive association with the anode or upper terminal member 140, except through the semiconductive element. The central dielectric body or spacer 138 contributes to maintaining this relationship and may actually be formed to adhere to the first major surface, if desired. To achieve conduction from the anode of the semiconductor device to the conduction layer the conduction layer is extended laterally so that it overlaps the inner edge of the auxiliary segment 209 and shorts the junction 220. This current flows from the anode through the metal layer 116, back up plate 112, first major contact 108, first emitter layer 212, and auxiliary segment 211 to reach the outer edge of the conduction layer. The current flow with respect to the auxiliary segment causes a potential difference to develop so that electrons are injected into the first emitter layer from the auxiliary segment along the outer edge thereof. These injected electrons are collected by the first emitter junction and serve to initiate conduction across the base junction, conduction progressing from the outer periphery of the auxiliary segment outwardly to switch the remainder of the semiconductive element into conduction.

Turn on of the semiconductive element may then be seen as analogous to turn on of a central auxiliary remote gate thyristor, the current produced by which is used to turn on a concentric outer annular main current carrying remote gate thyristor. Turn on or switching of the semiconductor device from its high impedance forward biased condition to its low impedance conducting mode is quite rapid since the output of the auxiliary thyristor serves as an amplified gate signal driving the main thyristor into conduction. This increase in the switching rate constitutes an improvement in the rate of current increase or *di/dt* that can be tolerated by the device without localized overheating or damage. At the same time since the auxiliary remote gate thyristor output is effectively being used to provide gate drive for the remote gate main thyristor it is appreciated that the strength of the gate signal to initiate conduction need only be strong enough to drive the auxiliary remote gate thyristor into conduction and need not be strong enough to directly drive the main thyristor without intermediate amplification.

The initiation of lateral current flow from the first major contact laterally through the first emitter layer, across the injection junction 220, laterally across the auxiliary segment, and laterally through the outer edge of the conduction layer for further conduction through the auxiliary zone of the first emitter layer, first base layer, second base layer, and second emitter layer for ultimate conduction to the device cathode is a unique feature of my invention. As above noted I consider the concept of leaving the conduction layer floating, that is, free of external ohmic connection, as to an anode terminal, to be novel. Further, it is to be noted that the conduction layer preferably only overlaps the inner edge of the auxiliary segment. This accentuates the potential drop in lateral conduction through the auxiliary segment, shifts electron injection more sharply toward the outer periphery of the auxiliary segment than is observed normally in the firing of a remote gate thyristor, and improves the electron injection effectiveness of the auxiliary segment. Another feature of importance is the spacing between the outer periphery of the injection junction and the inner periphery of the first major contact. Assuming absolute uniformity of spacing, current flow from the anode to the conductive layer through the injection junction will be peripherally uniformly distributed even in the absence of any lateral resistance to current flow offered by the first emitter layer. In practice, some uneveness in spacing always exists so that a tendency toward conduction through the injection junction at its closest approach to the first major contact exists. It is a feature of my invention that I offset this tendency and assure uniform peripheral conduction through the injection junction by laterally displacing the auxiliary segment from the inner edge of the first major contact by a distance sufficient to provide a significant lateral resistance within the first emitter layer portion serving as a current conduction path therebetween. This then constitutes a resistance in series with any conducting portion of the injection junction and acts further peripherally to distribute current conduction rather than allowing current concentration as might otherwise occur. The lateral resistance is chosen to produce a potential difference in the first emitter layer between the injection junction and the inner periphery of the first major contact of at least one half the value of the contact potential of the injection junction.

Figure 3:
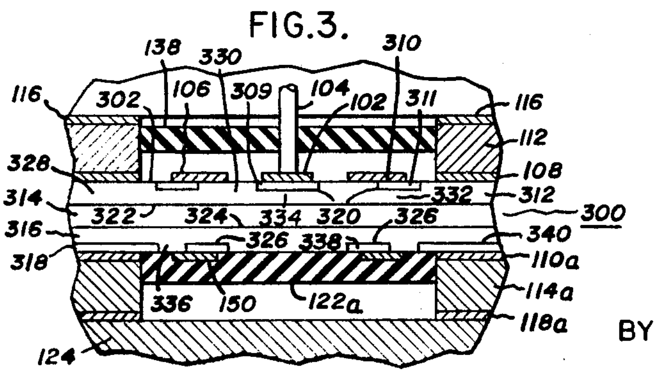
FIG. 3 is a sectional detail of a modified form of my invention with only the modified structural portions being shown.

In FIG. 3 a sectional detail is shown of a second embodiment of my invention. Except as specifically noted the elements of my second embodiment may be chosen to be identical to those of semiconductor device 100. As shown in FIG. 3 the gate metallization 102, gate lead 104, conduction layer 106, first major contact 108, back up plate 112, metal layer 116, insulative spacer 138, and lower terminal member 124 remain as previously described.

The semiconductive element 300 is provided with a first major surface 302 and a second major surface 304. The semiconductive element is comprised of a first endmost layer 310 comprised of a gate segment 309 and an annular auxiliary segment 311, first emitter layer 312, first base layer 314, second base layer 316, and a second emitter layer 318. Since the layers are formed by interleaved zones of opposite conductivity type, an injection junction 320 is formed between the first endmost layer and the first emitter layer, a first emitter junction 322 is formed between the first emitter layer and the first base layer, a base junction 324 is formed between the first and second base layers, and a second emitter junction 326 is formed between the second base layer and the second emitter layer. The first emitter layer is comprised of an annular main zone 328 and an annular auxiliary zone 330 integrally joined by annular injection zone 332. An injection zone 334 also underlies the gate segment. It may be readily observed that the first endmost layer, first emitter layer, first base layer, injection junction, first emitter junction, and base junction are identical to those of semiconductive element 200 and do not require redescription.

The semiconductive element 300 is distinctive in the configuration of the second emitter layer so that it is divided by an intervening portion 336 of the second base layer into a central auxiliary portion 338 and a main portion 340. It is to be noted that the outer edge of the injection junction and auxiliary segment are located in lateral proximity to the inner edge of the main portion. In the preferred form the outer periphery of the auxiliary segment and the inner periphery of the main portion are along a common annular boundary drawn normal to the major surfaces of the semiconductive element. It is appreciated that a slight lateral overlap or spacing of the main portion and auxiliary segment may be tolerated so long as lateral adjacency is maintained. The auxiliary portion of the second emitter layer is noted to be spaced inwardly from the outer edge of the auxiliary segment by the radial width of the intervening portion. The inner edge of the auxiliary portion extends inwardly beyond the inner edge of the auxiliary segment. A metal conduction layer 150 overlies the second major surface of the semiconductive element from a location overlying the intervening portion of the second base layer, but spaced laterally inwardly from the main portion, to a location spaced laterally inwardly of the inner edge of the injection junction, but laterally outwardly of the inner edge of the auxiliary portion. It is to be noted that the metal conduction layer 150 provides a low impedance conductive path from the auxiliary portion to the intervening portion of the second base layer across the outer edge of the portion of the second emitter junction associated therewith.

In analyzing the semiconductive element 300 it should be noted that the auxiliary zone of the first emitter layer and the conduction layer 106 are associated with a portion of the first major surface that overlaps a portion of the second major surface associated with the auxiliary portion of the second emitter layer and the conduction layer 150. Thus, inwardly of the auxiliary segment a PNPN sequence of zones exist which may be viewed as an auxiliary remote gate thyristor for which the conduction layer 106 may serve as the anode and the conduction layer 150 may serve as the cathode when the first emitter layer is of P conductivity type.

It is to be noted that the second major contact layer **110*a*, the back up plate 114*a*, and the metal layer 118*a* are modified in that they do not extend inwardly beyond the inner edge of the main portion of the second emitter layer, but are spaced slightly outwardly therefrom. Similarly as for the semiconductive element 200, the first major contact and the main zone of the first emitter layer are associated with a portion of the first major surface which overlaps a portion of the second major surface associated with the main portion of the second emitter layer and the second major contact. Thus, the portion of the semiconductive element 300** lying exterior the inner edge of the auxiliary segment may be seen to be analogous to a main current carrying remote gate thyristor.

The FIG. 3 embodiment of my invention blocks current flow when reverse biased and when forward biased, in the absence of a gate signal, similarly as described in connection with the preceding embodiment. The FIG. 3 embodiment is, however, distinctive in its switching characteristics from its forward biased blocking mode to its conducting mode. Assuming for convenience that the first emitter layer is of P conductivity type, so that the first terminal member serves as the device anode, biasing the gate terminal negative with respect to the anode causes the auxiliary remote gate thyristor portion of the device lying inwardly of the inner edge of the auxiliary segment to be switched into conduction. When this occurs current flows from the first major contact laterally through the first emitter layer, laterally through the auxiliary segment, through the conduction layer 106, through the auxiliary zone 330, through the central portion of the base layers, through the auxiliary portion of the second emitter layer, through the conduction layer 150, through the intervening portion of the second base layer, and through the main portion of the second emitter layer to the second major contact and cathode of the device. As in the case of the semiconductive element 200 lateral current flow through the auxiliary segment causes electron injection from the auxiliary segment into the second base layer to break down the depletion layer associated with the base junction. At the same time a lateral potential drop is created by the lateral current flow at the inner edge of the main segment of the second emitter layer. Thus electron injection is also induced from the second emitter layer into the second base layer to break down the depletion layer associated with the base junction. The effectiveness of the auxiliary remote gate thyristor portion in switching the main current carrying thyristor portion is accordingly significantly enhanced, since charge injection to the blocking base junction occurs simultaneously from both sides thereof. Further, the charges impinge upon what may be identical or very closely adjacent areal portions of the base junction. The result is that the speed and reliability with which the semiconductor device may be switched to its conducting mode is greatly enhanced.

It is to be noted that both the conduction layers 106 and 150 are free of direct conductive association with the terminals of the semiconductor device, except through the semiconductive element. The dielectric body 122a is shown overlying the conduction layer 150 centrally of back up plate 114a. This arrangement is advantageous in that the back up plate after attachment to the second major surface of the semiconductive element can serve as the sole retaining dam for the central dielectric material when it is molded in position. If desired, a similar body of dielectric material may be formed to overlie the conduction layer 106 and the first major surface of the semiconductive element located centrally of the back up plate 112. Such dielectric body could be readily consolidated with the spacer 138. It is considered a distinct advantage of my invention and a preferred structural feature that I leave both the conduction layers 106 and 150 floating, that is, free of direct conductive ohmic association with terminal leads for the device other than through the semiconductive element, although the layers may be provided with external leads, if desired. For example, current may be conducted from such a lead to trigger one or more additional thyristors. As previously described the spacing between the auxiliary segment and inner edge of the first major contact is chosen so that the portion of the first emitter layer therebetween provides a resistance to current flow through the auxiliary thyristor portion sufficient to produce a potential difference thereacross of at least one half of the contact voltage of the injection junction, thereby insuring that the current flow to the auxiliary thyristor is uniformly distributed around the outer edge of the conduction layer 106. Similarly the spacing between the outer edge of the conduction layer 150 and the inner edge of the main portion of the second emitter layer is chosen to provide a lateral resistance through the intervening portion of the second base layer sufficient to produce a potential difference in series with the inner edge of the second emitter junction at least one half the contact voltage of that junction. This insures that auxiliary thyristor current flows uniformly from the outer edge of the conduction layer 150 to the inner edge of the second injection layer without crowding of current at a point of minimum spacing therebetween.

FIGS. 4, 5, 6*a*, and 6*b* are illustrative of a third embodiment of my invention. Portions of the third embodiment necessary to form a complete semiconductor device not shown or specifically described may be identical to corresponding portions of the semiconductor device 100 and have been omitted as superfluous to an understanding of the invention.

Semiconductive element 400 is provided with a first major surface 402 and a second major surface 404 joined by positively beveled edge 406 and negatively beveled edge 408. The semiconductive element is provided with five sequentially arranged layers extending between the opposed major surfaces. A first endmost layer 410 is located adjacent the first major surface. The first endmost layer is comprised of a gate segment 409 and an auxiliary segment 411. An adjacent intermediate layer, first emitter layer 412, also lies adjacent the first major surface. First base layer 414 is located adjacent the first emitter layer while second base layer 416 is located between the first base layer and the second emitter layer 418, which forms the second endmost layer and lies adjacent the second major surface. Adjacent of the sequential layers are of opposite conductivity type so that junctions are formed therebetween. An injection junction 420 is located between the first endmost layer and the first emitter layer. A first emitter junction 422 is located between the first emitter layer and the first base layer. A base junction 424 is located between the first and second base layers, and a second emitter junction 426 is located between the second base layer and the second emitter layer.

It is to be noted that the auxiliary segment is comprised of an inner active annular portion 411*a* and an outer active annular portion 411*b* laterally spaced therefrom. The inner and outer active portions are integrally joined by radial finger portions 411*c*. The auxiliary segment forms the first emitter layer into a plurality of main zones 412*a*, a first auxiliary zone 412*b* lying interiorly of the inner portion of the auxiliary segment, and a second auxiliary zone 412*c* lying exteriorly of the outer portion of the auxiliary segment. An injection zone 412*d* integrally joins adjacent main and auxiliary zones. A conduction layer portion 106*a* covers the first auxiliary zone 412*b* adjacent the first major surface and overlaps the inner periphery of the injection junction 420. A second conduction layer portion 106*b* overlies the inner portion of the second auxiliary zone 412*c* and overlaps the outer periphery of the injection junction. A plurality of conduction layer portions 106*c* extend between and integrally join the first and second conduction layer portions. The conduction layer portions 106c overlie radial finger portions of the gate layer and are spaced from the injection junction.

The second emitter layer is divided into an auxiliary portion 438 and a plurality of main sub-portions 440, which together form a main portion. The auxiliary portion is comprised of a central auxiliary sub-portion 438*a*, which is of annular configuration, and an outer auxiliary sub-portion 438*b*, also annular. These laterally spaced annular auxiliary sub-portions are integrally joined by a plurality of radially extending auxiliary sub-portions 438*c*. A first conduction layer portion 150*a* overlies the auxiliary segment portion 438*a* and extends outwardly beyond the periphery thereof to contact a portion of the second base layer adjacent the second major surface intermediate the first annular auxiliary sub-portion and the inner periphery of the main sub-portions. The conduction layer portion 150*a* is laterally spaced inwardly from the inner edge of the main portion. A conduction layer portion 150*b* overlies the annular auxiliary sub-portion 438*b* and similarly extends inwardly to contact a portion of the second base layer adjacent the second major surface intermediate the auxiliary sub-portion 438*b* and the outer edge of the main portion. Again the conduction layer portion 150*b* is spaced laterally from the edge of the main portion. It can then be seen that the conduction layer portions 150*a* and *b* short the edge of the second emitter junction nearest the main portion, The conduction layer portions 150*a* and *b* are integrally joined by connecting finger conduction layer portions 150*c* which overlie the radially extending auxiliary sub-portions 438*c*. The conduction layer portions 150*c* are spaced from the second base layer.

It is to be noted that the radial finger portions 411c of the auxiliary segment and the conduction layer portions 106*c* are associated with a portion of the first major surface of the semiconductive element that overlaps a portion of the second major surface associated with the auxiliary sub-portions 438c of the second emitter layer and the conduction layer portions 150c. That is, the pattern of radial fingers associated with the opposite major surfaces of the semiconductive element are aligned in a direction normal to the major surfaces. At the same time it can be seen that the conduction layer portion 106a and auxiliary zone 412b are associated with a portion of the first major surface that overlaps a portion of the second major surface associated with the auxiliary sub-portion 438a and conduction layer portion 150a. Similarly, the conduction layer portion 106b is associated with the auxiliary zone 412c over a portion of the first major surface that overlaps a portion of the second major surface associated with the auxiliary segment portion 438b and conduction layer portion 150b. Thus, the semiconductive element may be noted to form a central auxiliary thyristor portion lying inwardly of the inner periphery of the injection junction and a peripheral auxiliary thyristor portion lying exteriorly of the outer periphery of the injection junction. These two auxiliary thyristor portions are conductively joined by the radially extending portions 106c and 150c of the conduction layers.

The main thyristor portions of the semiconductive element are noted to lie between the inner and outer auxiliary thyristor portions and between the portions radially laterally connecting these auxiliary thyristor portions. A first major contact is noted to be made up of a plurality of segments 108a associated with the main zones 412a of the first emitter layer. A second major contact is comprised of a plurality of segments 110b associated with portions of the second major surface formed by the main sub-portions 440. The second major contact segments lie laterally inwardly from the periphery of the main sub-portions, except adjacent the outer periphery where the second major contact segments may be coextensive with the main segments or slightly overlap the second emitter junction in shorting relationship. The first major contact segments 108a are associated with the first emitter layer main conduction zones over portions of the first major surface that overlap areas of the second major surface associated with the main segments of the second emitter layer and segments of the second major contact. Thus, a plurality of main current carrying thyristor portions are formed.

In order to avoid inadvertent contact of the back up plates 112a and 114b with the conduction layer portions 106c and 150c, respectively, the back up plates are provided with grooves 152 adjacent their inner faces. Since the outer major surfaces of the back up plates are not affected, the metal layers 116a and 118b may be substantially identical to the layers 116 and 118 previously described. The gate metallization 102 may also be identically formed as previously described. The dielectric body 120a may be formed similarly as the dielectric body 120. The dielectric body 122b is shown formed of a glass passivant applied to the first major surface of the semiconductive element prior to association of the back up plate 114b therewith.

The embodiment of my invention shown in FIGS. 4, 5, 6a, and 6b is similar to the FIG. 3 embodiment of my invention in its general operating characteristics, but offers switching advantages in addition to those of the previously described embodiment. In switching into conduction when forwardly biased as a result of a gate signal, the central auxiliary thyristor portion of the semiconductive element 400 behaves generally similarly as the auxiliary thyristor portion of the semiconductive element 300. Additionally, however, a portion of the current flowing through the conduction layers 106a and 150a is shunted laterally by the conduction layer portions 106c and 150c to the outer annular portions 106b and 150b of these conduction layers. This then turns on the outer annular auxiliary thyristor portion of the semiconductive element. Breakdown of the base junction by charge injection to the layers on opposite sides thereof then not only spreads laterally outwardly to turn on the main thyristor portions, but simultaneously the base junction depletion layer is broken down adjacent the outer edge of the main sub-portions and turn on also proceeds inwardly. With turn on of the main current carrying thyristor portions proceeding both inwardly and outwardly simultaneously the rate of device turn on is increased.

Another distinctive operational advantage of the semiconductive element 400 may be appreciated when the possibility is considered of turn on of the device as a result of surface currents, a high rate of voltage increase, or avalanche produced by an excessively large potential difference applied across the main current carrying terminals—i.e., device turn on mechanisms initiated by means other than a gate applied signal. For example, considering the situation in which the semiconductive element is not adequately beveled or passivated over its outer periphery, it can be readily appreciated that a voltage transient will have the effect of turning the device on adjacent its outer edge. In a conventional thyristor the high current density produced by turn on in this manner will cause localized overheating and destroy the semiconductive element. Even in my inventive embodiment the central auxiliary thyristor portion being laterally removed from the outer periphery of the semiconductive element is ineffective to protect the device from excessive *di/dt* localized adjacent the outer edge of the device. The outer annular auxiliary thyristor portion, however, will be readily turned on by such a peripheral current and can be relied upon to protect the device from failure due to localized turn on of the device at or near the edge of the semiconductive element. Even though the semiconductive element may be adequately beveled and passivated to prevent surface currents turning on the semiconductive element, turn on of the device at a localized point due to avalanche through the bulk of the semiconductive element may nevertheless occur and, unless the current density is maintained at an acceptably low level by rapid current spreading, destruction of the device may occur. By distributing the auxiliary thyristor portions so that they are present adjacent both the center and outer periphery of the semiconductive element the opportunity of turning on an auxiliary thyristor portion and accelerating current spreading before damage to the semiconductive element can occur is enhanced.

FIG. 7 illustrates an embodiment of my invention generally similar to the embodiment of FIG. 3, but providing novel ballasting arrangements. Only the structure of the semiconductive element and the conduction layers is described in detail, since remaining device elements may be identical to those previously described in connection with FIG. 3.

The semiconductive element 500 is provided with a first major surface 502 and a second major surface 504 joined by a positively beveled peripheral surface 506 and a negatively beveled peripheral surface 508. The first endmost layer 510 is divided into a gate segment 509 and an auxiliary segment which latter is in turn divided into an active outer auxiliary segment 511*a* and an inner ballasting segment 511*b*. Next adjacent thereto is provided a first emitter layer 512. Interiorly of the first emitter layer is a first base layer 514 followed by a second base layer 516. A second emitter layer 518 is provided adjacent the second major surface. The layers are formed with adjacent layers being of opposite conductivity type, so that an injection junction 520 is formed between the first endmost and first emitter layer, a first emitter junction 522 is formed between the first emitter layer and the first base layer, a base junction 524 is located between the base layers, and a second emitter junction 526 is located between the second base layer and second emitter layer. The second emitter layer is divided into two auxiliary portions 538*a* and 538*b*, where portion 538*a* is the active auxiliary portion and 538*b* is the ballasting auxiliary portion. The second emitter layer additionally includes a main portion 540.

The voltage blocking characteristics of the semiconductive element 500 may be identical to those of the semiconductive element 300. When the first emitter layer is of P conductivity type and the first major contact associated therewith is at a positive potential as compared with the potential of the second major contact, the semiconductive element 500 may be switched to its conductive mode rendering the gate terminal of the device negative with respect to the device anode terminal. This triggers into conduction an auxiliary thyristor portion lying laterally inward of the outer auxiliary segment 510*a*. The anode of the auxiliary thyristor portion is formed by annular conduction layer 154 while the cathode is formed by annular conduction layer 156. The cathode emitter layer for the auxiliary thyristor portion is formed by auxiliary portion 538*a*. It is to be noted that the conduction layer 154 is laterally offset from the auxiliary portion 538*a*. Current flow for the auxiliary thyristor portion is from the first major contact laterally through the first emitter layer to the outer auxiliary segment, laterally through the outer segment to the conduction layer 154, from the conduction layer 154 diagonally through the first emitter layer and base layers to the inner auxiliary portion 538*a* of the second emitter layer, laterally through the conduction layer 156 and laterally through the second base layer to the inner edge of the main portion of the second emitter layer to the second major contact. Normally no significant portion of the current flows through the inner auxiliary segment or the outer auxiliary portion of the second emitter layer. Turn on of the main current carrying thyristor portion of the semiconductive element 500, which is identical to that of the semiconductive element 300, is achieved by simultaneous electron injection from the outer edge of the auxiliary segment and the inner edge of the main portion of the second emitter layer.

The advantage of the structural arrangement of semiconductive element 500 is in its insurance that charge injection will occur along the entire inner periphery of the main segment of the second emitter layer and the entire outer periphery of the gate layer, rather than occurring only at a localized point. In preceding embodiments it is to be noted that I have specified a minimum resistance for the portion of the first emitter layer carrying current to the auxiliary thyristor portion from the first major contact. In the FIG. 7 embodiment a series resistance is noted to be provided by the lateral offset of the conduction layer 154 from the inner auxiliary portion of the second emitter layer. The inner auxiliary segment of the first endmost layer in reducing the width of the first emitter layer available for current flow further contributes to the value of the series resistance. Uniform turn on of the inner edge of the main portion of the second emitter is assured by the series resistance increasing effect of the outer auxiliary portion of the second emitter layer, which is unavailable for current flow therethrough, restricting the width of the second base layer that is available for current flow.

In FIGS. 8 and 9 a semiconductive element 600 having conduction layers and contacts associated therewith is shown. In FIG. 9 dielectric material is also shown associated with the semiconductive element. The semiconductive element is provided with a first major surface 602 and a second major surface 604. The semiconductive element is comprised of five sequentially arranged layers of alternating conductivity type, including first endmost layer 606, first intermediate layer 608, center layer 610, second intermediate layer 612, and second endmost layer 614. A first junction 616 is formed between the first endmost and intermediate layers. A second junction 618 is formed between the first intermediate and center layers. A third junction 620 is formed between the center layer and the second intermediate layer, and a fourth junction 622 is formed between the second intermediate and endmost layers.

The first endmost layer is divided into a main segment 624 which in the configuration shown is semi-annular. Laterally spaced from the main segment is a first auxiliary segment 626 which is also of semi-annular configuration. A gate segment 628 is laterally spaced from the first auxiliary segment and is shown formed of semi-circular configuration. A second auxiliary segment 630 is laterally spaced from the gate segment and is shown of semi-annular configuration.

A first major contact 632 overlies the main segment of the first endmost layer and a portion of the first intermediate layer adjacent the first major surface. As shown the first major contact is of annular configuration having its inner edge spaced laterally outwardly from the inner edge of the main segment so as to avoid shorting the first junction at that edge. A second major contact 634 overlies the entire second major surface. It is to be noted that the second endmost layer is semi-circular in configuration and that the first and second endmost layers are laterally offset with the dashed line 636 in FIG. 8 demarcating co-extensive edges of the endmost layers. Thus, the first major contact cooperates with the first endmost layer over an areal portion of the first major surface that overlaps an areal portion of the second major surface associated with the second major contact and the second intermediate layer.

Between these overlapping area portions a first PNPN sequence of layers is present which may be considered to form a first main thyristor portion. The first main thyristor portion M–1 is designated in FIG. 9 as extending laterally from the outer periphery of the first auxiliary segment to the periphery of the semiconductive element. It is accordingly apparent that in the form shown the first main thyristor portion is of semi-annular configuration. In an analogous manner it is apparent that to the left of the demarcation line 636 a second main thyristor portion is formed, since four layers are present between the major contacts forming a PNPN sequence. It is noted that the sequence of P and N layers of the first and second main thyristor portions are opposite. The second main thyristor portion M–2 is designated in FIG. 9 as extending laterally from the inner periphery of the second auxiliary segment to the periphery of the semiconductive element. The second main thyristor portion is of semi-annular configuration in the form shown.

Centrally of the main thyristor portions of the semiconductive element is the auxiliary thyristor portion. A gate contact 638 is centrally located overlying a portion of the gate segment and a gate auxiliary zone 640 separating the first auxiliary and gate segments. Gate lead 104 is shown conductively associated with the gate contact. The auxiliary thyristor portion may be seen to be in fact two auxiliary thyristor portions sharing a common gate. The first auxiliary thyristor portion A–1 is of semi-circular configuration and includes the gate zone and the first auxiliary segment as well as the underlying portions of the center and second intermediate layers. It can be seen that a PNPN sequence of layers exists over the area of the first auxiliary thyristor portion defined by the first auxiliary segment. A first conduction layer 642 extends from the first auxiliary segment to a first auxiliary zone 644 of the first intermediate layer associated with first main thyristor portion.

Second auxiliary thyristor portion A–2 forms a PNPN sequence of layers over the areal portion thereof defined by a second auxiliary zone 646 separating the gate and second auxiliary segments. A second conduction layer 648 extends from the second auxiliary zone to outer edge of the second auxiliary segment associated with second main thyristor portion.

To provide edge protection to the semiconductive element against peripheral surface currents an annular glass passivant layer 650 is shown peripherally associated with the outer edge thereof and overlying the voltage blocking junction 618 and 620 of the device. A body 652 of dielectric material is also shown associated with the first major surface inwardly of the first major contact to avoid surface currents. It is appreciated that sub-assembly shown in FIG. 9 may be readily mounted in a semiconductor device housing identical to that shown in FIG. 1 or in any conventional triac housing.

The operation of my triac may be best appreciated by considering the first endmost layer 606 to be of N conductivity type, which is preferred, although this layer could be of opposite conductivity type, if desired. When the first major contact 632 is biased negative with respect to the second major contact 634, no current will flow through the semiconductive element between the contacts in the absence of a gate signal, since the second junction 618 is reverse biased. Surface currents at the periphery of the semiconductive element are prevented by the positive beveling of the blocking junction 618 and by the protection of the junction edge by glass passivant layer 650.

When the first major contact is biased negative relative to the second major contact, the semiconductive element may be switched to its conducting mode by biasing the gate lead 104 positive with respect to the first major contact. This places the auxiliary thyristor portion A–1 in its conductive mode and this auxiliary thyristor portion through the first conduction layer 642 delivers a positive control signal to the first auxiliary zone 644 of the first main thyristor portion that drives the first main thyristor portion into conduction. It can be seen that in this instance second major contact serves as an anode for both the auxiliary and main thyristor portions A–1 and M–1. The conduction layer 642 serves as a cathode for the auxiliary thyristor portion and as a gate connection for the main thyristor portion. The first major contact serves as the cathode for the main thyristor portion M–1. It is to be noted that the auxiliary thyristor portion A–1 has the effect of greatly amplifying and distributing the gate signal supplied by the gate lead, since when the auxiliary thyristor portion A–1 is switched to its conducting mode the conduction layer 642 approaches the positive potential of the second major contact. So long as the first major contact remains at a negative potential with respect to the second major contact the second auxiliary thyristor portion and the second main thyristor portion of the semiconductive element remain inactive.

When the first major contact is biased positive relative to the second major contact, the semiconductive element will remain non-conductive in the absence of a gate signal, since the third junction 620 is reverse biased. Surface current conduction at the periphery of the device is prevented by the glass passivant layer 650 and by the positive beveling of the periphery of the semiconductive element adjacent this junction. This means, of course, in the configuration shown the central layer possesses a resistivity higher than that of the remaining layers, as is most typically the case.

With the first major contact biased positive with respect to the second major contact the semiconductive element may be switched to its conductive mode by biasing the gate lead negative with respect to the anode or first major contact. This provides a negative gate signal to the second auxiliary thyristor portion A–2 which in turn triggers the main thyristor portion M–2. It is considered unnecessary to review this mechanism in detail, since it may be seen to be identical to that described with reference to the first embodiment of my invention.

The principal advantage of the embodiment of my invention shown in FIGS. 8 and 9 is that it allows amplification of a gate signal to allow a controlled thyristor to be switched to its conductive mode regardless of the direction of the potential gradient applied across the terminals. Further, this is achieved with only a single gate lead attachment.

While I have described my invention with reference to certain illustrative preferred embodiments, it is appreciated that numerous variations will readily occur to those skilled in the art. For example, while I prefer to utilize the device housing of FIG. 1, it is appreciated that a wide variety of alternative device housing constructions are available and may be substituted in whole or in part. The device housing need not be hermetically sealed, but where the device is hermetically sealed the dielectric body 120 may be omitted. While device operation has been described by reference to the first emitter layer as a P conductivity type layer and the lower terminal member as the device cathode, it is appreciated that the first emitter layer may be of N conductivity type and the lower terminal member may serve as the device anode. The designation of the terminal members as lower and upper is undertaken merely for ease of description and is not intended to imply that the device is useable only in the orientation shown.

While I have described my invention with reference to a center gate semiconductive element, it is appreciated that my invention may be practiced with a peripheral gate, a laterally positioned gate, a distributed gate, or other conventional geometric arrangements for thyristor elements. Assuming a peripheral or distributed gate, for example, gate attachment for the device embodiment of FIGS. 4, 5, **6*a* and 6*b*** would be peripherally outwardly of the first main contact and one or more gate segments would be positioned beneath the gate metallization of the first major surface.

In this circumstance the inner auxiliary portion of the second emitter layer as well as the inner gate segment could (but need not) be omitted. With a center gate either the outer portion of the auxiliary segment or the outer auxiliary portion of the second emitter layer could be omitted without loss of ability to turn on the device due to non-gate generated currents. The finger portions of the auxiliary segment may be retained even if the outer or inner portions of the auxiliary portion are omitted, since it is noted that the finger portions of the auxiliary portions are active during device turn on. The number of radially extending portions associated with the first and second major surfaces is not critical, four being shown merely as exemplary. The provision of grooves in the back up plate to avoid contact with the radially extending portions of the conduction layers is not essential. These radial portions may be covered by a thin insulative layer or may be formed sufficiently thin compared to the thickness of the major contacts so that the back up plates do not touch these layers. Alternately, the conduction layer portions extending radially may be associated with portions of the semiconductive element etched down from the major surfaces to provide clearance between the conduction layers and the back up plates. It is appreciated that the radially extending portions of the auxiliary portion and the auxiliary segment may be omitted entirely when the radial portions of the conduction layers are omitted. In such circumstance the conduction shunt connection between the inner and outer annular portions of the conduction layers may be separate, suitably insulated shunt wires or other discrete connectors. In one form the radially extending portions of the conduction layers may be electrically insulated from the major surfaces of the semiconductive element although supported thereby. In this instance also the radial portions of the gate segment and the auxiliary segment may be omitted. This offers the advantage of allowing the main thyristor portion to be unitarily formed rather than being sub-divided into quadrants as shown.

Figure 5:
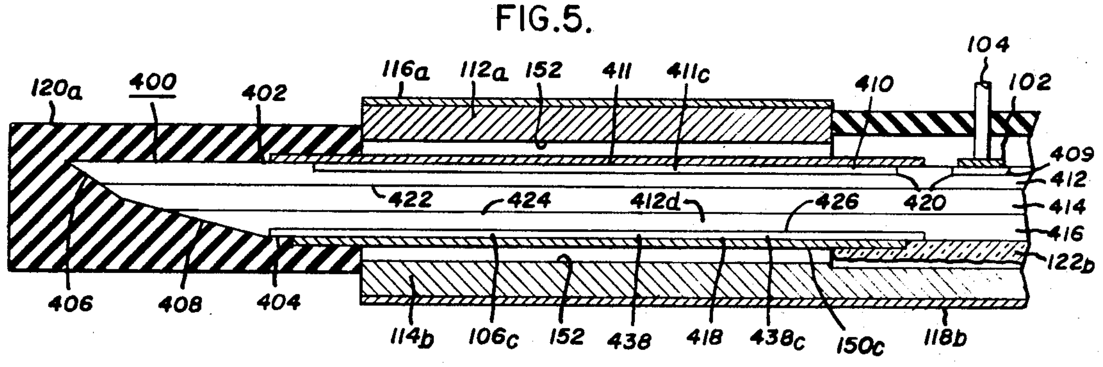

The resistance between the outer edge of the auxiliary segment and the inner edge of the first major contact may be increased by etching the semiconductive element from its first major surface. Similarly, the resistance between the outer edge of the conduction layer and the inner edge of the main portion of the second emitter layer may be increased by etching the semiconductive element from its second major surface. Neither of these approaches is considered as desirable as the incorporation of diffused segments, however, as shown in FIG. 5, since diffusion depths may be controlled with greater accuracy than the depth of etching. In addition to shorting the second base layer to the second major contact as shown, it is appreciated that the first base layer may be shorted to the first major contact in like fashion. While preferred for device stability, as is well understood in the art, shorting of either or both of the base layers to the major contacts is not required.

Figure 4:
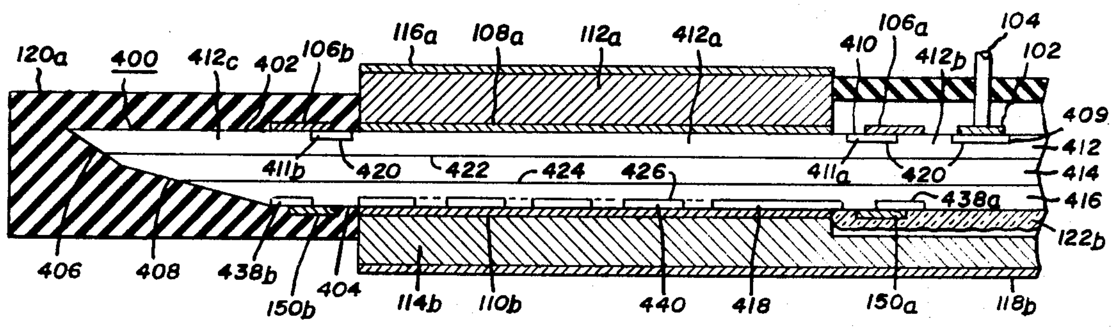
FIGS. 4 and 5 are directed to a third embodiment of my invention showing sectional details similar to FIG. 2.

As may be readily appreciated by those skilled in the art the various structural variations of the FIG. 1 embodiment of my invention described with reference to FIGS. 3, 4, 5, **6*a*, 6*b*, and 7 may be readily applied to the form of my invention shown in FIGS. 8 and 9**.

Having described my invention with reference to certain preferred embodiments, it is appreciated that numerous variations will readily occur to those skilled in the art. It is accordingly intended that the scope of my invention be determined with reference to the following claims.

What I claim and desire to secure by Letters Patent of the United States is:

1. A thyristor comprised of first and second terminal means for facilitating current conduction through said thyristor in its switched on state including a first major contact and a second major contact, respectively, semiconductive means for selectively permitting current conduction between said first and second terminal means in response to a gate signal comprised of a semiconductive element including five layers of one and the opposite conductivity type, said layers being interleaved with adjacent layers being of opposite conductivity type and forming a plurality of P-N junctions, said layers including a first endmost layer and a first intermediate layer next adjacent thereto, said first endmost layer including a gate segment and an auxiliary segment spaced laterally therefrom, said first intermediate layer including an auxiliary zone interposed between said gate segment and said auxiliary segment, a main zone laterally spaced from said auxiliary zone by said auxiliary segment, and injection zone means underlying said auxiliary segment of said endmost layer, said injection zone means uniting said main and auxiliary zones, means for transmitting an amplified gate signal providing a junction bridging conductive path from said auxiliary segment to said auxiliary zone, said first major contact being ohmically associated with said main zone, and said second major contact being ohmically associated with a remaining endmost of said layers.

2. A thyristor according to claim 1 additionally including means isolating said junction bridging conductive path means from conductive association with said contacts other than through said semiconductive element.

3. A thyristor according to claim 1 in which said gate segment is centrally positioned and said auxiliary segment is annular and spaced outwardly of said gate segment.

4. A thyristor according to claim 1 including series resistance means associated with said first intermediate layer to insure uniform peripheral turn on of said main zone thereof.

5. A thyristor according to claim 1 in which said first endmost layer is divided into a first auxiliary segment next adjacent to said main zone serving as a charge injection source and a laterally spaced second auxiliary segment spaced from said main zone by said first auxiliary segment, said second auxiliary segment constricting the width of said first intermediate layer adjacent thereto to increase the lateral resistance of said first intermediate layer.

6. A thyristor according to claim 1 additionally including means associated with the periphery of said semiconductive element for reducing surface currents.

7. A thyristor according to claim 1 in which said first endmost layer is located laterally inwardly of said main zone and in which beveled edge means of said semiconductive element are provided for reducing surface potential gradients.

8. A thyristor according to claim 1 additionally including a main current carrying terminal means, conductive plate means interposed between said terminal means and said first major contact, and dielectric means associated with said semiconductive element positioning said conductive plate means relative to said terminal means.

9. A thyristor according to claim 1 in which said layers of said semiconductive element extend between opposed major surfaces, said remaining endmost layer including a main portion and an auxiliary portion, said first and second major contacts, said main portion, and said main zone are associated with overlapping areas of said opposed major surfaces, and said second major contact, said auxiliary portion, said auxiliary zone, and said conductive path means are associated with overlapping areas of said opposed major surfaces.

10. A thyristor comprised of a semiconductive element including five layers of one and the opposite conductivity type extending between opposed major surfaces, said layers being interleaved with adjacent layers being of opposite conductivity type and forming a plurality of P-N junctions, said layers including a first endmost layer and a first intermediate layer next adjacent thereto, said first endmost layer including a gate segment and an auxiliary segment spaced laterally therefrom, said first intermediate layer including an auxiliary zone interposed between said gate segment and said auxiliary segment, a main zone laterally spaced from said auxiliary zone by said auxiliary segment, and injection zone means underlying said endmost layer, said injection zone means uniting said main and auxiliary zones, a second endmost layer being divided by a second intermediate layer next adjacent thereto into an auxiliary portion and a main portion, first means providing a junction bridging conductive path from said auxiliary zone to said auxiliary segment, second means providing a junction bridging conductive path from said auxiliary portion to a portion of said second intermediate layer adjacent said main portion, a gate contact ohmically associated with said gate segment, a first major contact ohmically associated with said main zone, a second major contact ohmically associated with said main portion, said first and second major contacts, said main zone, and said main portion being associated with overlapping areas of said opposed major surfaces, said conductive path means, said auxiliary zone, and said auxiliary portion being associated with overlapping areas of said opposed major surfaces, and said auxiliary segment being located in lateral proximity to said main portion.

11. A thyristor according to claim 10 in which said auxiliary portion of said second endmost layer is divided into a first auxiliary portion and a laterally spaced second auxiliary portion, said first auxiliary portion being associated with said second conductive path means and said second auxiliary portion being laterally spaced from and interposed between said first auxiliary portion and said main portion constricting the width of said second intermediate layer adjacent thereto to increase the lateral resistance of said second intermediate layer.

12. A thyristor comprised of a semiconductive element including five layers of one and the opposite conductivity type extending between opposed major surfaces, said layers being interleaved with adjacent layers being of opposite conductivity type and forming a plurality of P-N junctions, said layers including a first endmost layer and a first intermediate layer next adjacent thereto, said first endmost layer being formed as a plurality of laterally spaced segments including a gate segment and a plurality of auxiliary segment means, said first intermediate layer including a main zone extending between said auxiliary segment means, an auxiliary zone separated from said main zone by one of said auxiliary segment means, and injection zone means lying interiorly of said first endmost layer, said injection zone means integrally joining said main and auxiliary zones and said auxiliary zone separating said one auxiliary segment means from said gate segment, a gate contact ohmically associated with said gate segment, a first major contact ohmically associated with said main zone, means providing a junction bridging conductive path from said auxiliary zone to a plurality of said auxiliary segment means, additional contact means ohmically associated with a second endmost of said layers including a main portion and an auxiliary portion, said auxiliary portion, said auxiliary zone, said conductive path means, and said additional contact means being associated with overlapping areas of said opposed major surfaces, and said first major contact, said main zone, said main portion, and said additional contact means being associated with overlapping areas of said opposed major surfaces.

13. A thyristor according to claim 12 in which a second intermediate layer adjacent said second endmost layer divides said main portion and said auxiliary portion thereof into laterally spaced relation and said additional contact means includes a second major contact associated with said main portion and means providing a junction bridging conductive path from said auxiliary portion to a portion of said second intermediate layer separating said main and auxiliary portions.

14. A thyristor according to claim 12 in which said auxiliary segments are integrally joined.

15. A thyristor according to claim 12 in which said auxiliary segment means are integrally joined and said conductive path means is comprised of conduction means ohmically associated with said semiconductive element at the integral joinder of said auxiliary segment means.

16. A thyristor according to claim 12 in which said auxiliary segment means are located adjacent spaced edge portions of said main zone and said auxiliary segment means include interconnecting means.

17. A thyristor according to claim 12 in which a plurality of auxiliary zones are provided each separated from said main zone by one of said auxiliary segment means.

18. A thyristor comprised of a semiconductive element including five layers of one and the opposite conductivity type extending between opposed major surfaces, said layers being interleaved with adjacent layers being of opposite conductivity type and forming a plurality of P-N junctions, said layers including a first endmost layer and a first intermediate layer next adjacent thereto.

said first endmost layer being formed as a plurality of laterally spaced segments including a gate segment and a plurality of auxiliary segment means.

said first intermediate layer including a main zone extending between said auxiliary segment means, a plurality of auxiliary zones each separated from said main zone by one of said auxiliary segment means, and injection zone means lying directly interiorly of said first endmost layer integrally joining said main and auxiliary zones, one of said auxiliary zones laterally spacing said gate segment from an auxiliary segment means, a gate contact ohmically associated with said gate segment, a first major contact ohmically associated with said main zone, first means providing a junction bridging conductive path from each of said auxiliary zones to adjacent of said auxiliary segment means, a second endmost layer being divided by a second intermediate layer next adjacent thereto into a main portion and a plurality of auxiliary portions, second means providing a junction bridging conductive path from said auxiliary portions to said second intermediate layer adjacent said main portion, a second major contact ohmically associated with said main portion, said first and second main contacts, said main zone, and said main portion being associated with overlapping areas of said opposed major surfaces, said conductive path means, said auxiliary zones, and said auxiliary portion being associated with overlapping areas of said opposed major surfaces, and said auxiliary segment means being located with an edge in lateral proximity to said main portion.

19. A thyristor according to claim 18 in which said auxiliary portions are integrally joined.

20. A semiconductor switch comprising a single semiconductive crystal means having integrated therein a remote gate main current carrying thyristor crystal means and a remote gate auxiliary thyristor crystal means, each of said thyristor crystal means including a gate layer, a first emitter layer, a first base layer, a second base layer, and a second emitter layer sequentially related, adjacent layers being of opposite conductivity type and forming a plurality of P-N junctions therebetween.

said emitter and base layers of said main and auxiliary thyristor crystal means being integrally related, said gate layers of said main and auxiliary thyristor means being laterally spaced, gate means associated with said auxiliary gate layer, means providing a junction bridging conductive path from said auxiliary first emitter layer to said main gate layer, a major current carrying contact ohmically associated with said main first emitter layer, and additional contact means ohmically associated with said second emitter layers.

21. A semiconductor switch comprising a single semiconductive crystal means having integrated therein a remote gate main current carrying thyristor crystal means and a remote gate auxiliary thyristor crystal means, said remote gate main current carrying thyristor means including a gate layer, a first emitter layer, a first base layer, a second base layer, and a second emitter layer sequentially related, adjacent layers being of opposite conductivity type and forming a plurality of P-N junctions therebetween, said auxiliary thyristor means including a gate layer, a first emitter layer, a first base layer, a second base layer, and a second emitter layer sequentially related, adjacent layers being of opposite conductivity type and forming a plurality of P-N junctions therebetween, corresponding emitter and base layers of said main and auxiliary thyristor means being integrally related with said main gate later lying adjacent the joinder of said thyristor means and said auxiliary gate layer being laterally spaced from said main gate layer by said auxiliary first emitter layer, gate means associated with said gate layer of said auxiliary thyristor means, common current carrying terminal means associated with said second emitter layers of said thyristor means, separate current carrying terminal means associated with each of said first emitter layers of said thyristor means and laterally spaced from said gate layer, and means for providing a conductive path between said auxiliary thyristor separate terminal means and an edge of said main gate layer adjacent said auxiliary thyristor means for laterally biasing said gate layer in response to a signal supplied to said gate means so that charge injection by said gate layer into said anode base layer preferentially occurs only along an edge closest to said terminal means associated with said first emitter layer of said main thyristor means.

22. A semiconductor switch according to claim 20 in which said auxiliary thyristor means is located adjacent opposed lateral extremities of said main current carrying thyristor means.

23. A semiconductor switch according to claim 21 additionally including means isolating said junction bridging conductive path means from conductive association with said terminal means other than through said semiconductive crystal means.

24. A semiconductor switch comprising a single semiconductive crystal means having integrated therein a remote gate main current carrying thyristor crystal means and a remote gate auxiliary thyristor crystal means, each of said thyristor crystal means including a gate layer, a first emitter layer, a first base layer, a second base layer, and a second emitter layer sequentially related, adjacent layers being of opposite conductivity type and forming a plurality of P-N junctions therebetween, said first emitter and said base layers of said main and auxiliary thyristor means being integrally related, said second emitter layers and said gate layers of said main and auxiliary thyristor means being laterally spaced, said main gate layer lying in lateral proximity to said main second emitter layer, gate means associated with said auxiliary gate layer, first means providing a junction bridging conductive path from said auxiliary first emitter layer to said main gate layer, second means providing a junction bridging conductive path from said auxiliary second emitter layer to a portion of said second base layer adjacent said main second emitter layer, and major contacts ohmically associated with said main emitter layers.

25. A triac having improved switching characteristics comprising a single semiconductive crystal means having integrated therein main current carrying triac crystal means and auxiliary triac crystal means, each of said triac crystal means including a first endmost layer, a first intermediate layer next adjacent thereto, a central layer, a second endmost layer, and a second intermediate layer interposed between said second endmost layer and said central layer, said layers being sequentially related with adjacent layers being of opposite conductivity type and forming a plurality of P-N junctions therebetween, said auxiliary triac means first endmost layer including a first auxiliary segment and a gate segment laterally spaced therefrom, said main triac means first endmost layer including a main segment and a second auxiliary segment laterally spaced therefrom, said first intermediate, central, second intermediate, and second endmost layers of said triac crystal means being integrally formed, a first major contact ohmically associated with said first endmost layer and said first intermediate layer of said main triac crystal means, a second major contact ohmically associated with and common to said second endmost and second intermediate layers of said triac crystal means, first means providing a junction bridging conductive path from said auxiliary triac means first auxiliary segment to said main triac means first intermediate layer, second means providing a junction bridging conductive path from said auxiliary triac means first intermediate layer to said main triac means second auxiliary segment, and gate means ohmically associated with said gate segment and said auxiliary triac means first intermediate layer.

26. A triac according to claim 25 additionally including means isolating said junction bridging conductive path means from conductive association with said contacts other than through said semiconductive element.

27. A triac according to claim 25 additionally including means associated with the periphery of said semiconductive crystal means for reducing surface currents.

28. A triac according to claim 25 in which said semiconductive crystal means is peripherally beveled to reduce surface potential gradients.

29. A triac according to claim 25 in which said gate means is located centrally of semiconductive crystal means.

30. A bilateral semiconductor switch comprising a semiconductive element including five layers of one and the opposite conductivity type, said layers being interleaved with adjacent layers being of opposite conductivity type and forming a plurality of P-N junctions, said layers including a first endmost layer and a first intermediate layer adjacent thereto, said first endmost layer including a main segment, a first auxiliary segment laterally spaced therefrom, a gate segment laterally spaced from said first auxiliary segment, and a second auxiliary segment laterally spaced from said gate segment, said first intermediate layer including a main injection zone underlying said main segment, a first auxiliary zone lying between said first auxiliary segment and said main segment, a gate zone lying between said first auxiliary segment and said gate segment, a second auxiliary zone lying between said gate segment and said second auxiliary segment, auxiliary injection zones underlying said gate and auxiliary segments, and a main zone separated from said gate segment by said second auxiliary zone, said zones of said first intermediate layer being integrally related, a second endmost layer having a major portion thereof spaced laterally from said first endmost layer, a second intermediate layer located adjacent said second endmost layer including a base zone underlying said second endmost layer and an emitter zone laterally related to said second endmost layer, a first major contact ohmically associated with said main segment of said first endmost layer and said main zone of said first intermediate layer, a second major contact ohmically associated with said second endmost layer and said emitter zone of said second intermediate layer, first means providing a junction bridging conductive path from said first auxiliary segment to said first auxiliary zone, second means providing a junction bridging conductive path from said second auxiliary segment to said second auxiliary zone, and gate means ohmically associated with said gate segment and said gate zone.

31. A thyristor comprising first and second spaced main current carrying terminal means, first main current carrying thyristor means conductively associated with said terminal means for blocking current flow between said terminal means therethrough and for selectively permitting current flow from said first terminal means to said second terminal means in response to an electrical signal, second main current carrying thyristor means conductively associated with said terminal means for blocking current flow between said terminal means therethrough and for selectively permitting current flow from said second terminal means to said first terminal means in response to an electrical signal, auxiliary thyristor means for amplifying electrical signals supplied to said main thyristor means, and a single gate lead associated with said auxiliary thyristor means for conducting electrical signals for switching said main thyristor means.

* * * * *